(12) United States Patent
Ripley

(10) Patent No.: US 12,543,296 B1
(45) Date of Patent: Feb. 3, 2026

(54) INTELLIGENT TRICKLING FILTER WATER RECYCLING TECHNOLOGY SUPPORTING ENERGY EFFICIENT EVAPORATIVE COOLING FOR DATA CENTER HEAT DISSIPATION

(71) Applicant: Dana K Ripley, Pleasanton, CA (US)

(72) Inventor: Dana K Ripley, Pleasanton, CA (US)

( * ) Notice: Subject to any disclaimer, the term of this patent is extended or adjusted under 35 U.S.C. 154(b) by 0 days.

(21) Appl. No.: 19/282,083

(22) Filed: Jul. 28, 2025

Related U.S. Application Data

(62) Division of application No. 19/092,790, filed on Mar. 27, 2025, now Pat. No. 12,396,143.

(51) Int. Cl.
*H05K 7/20* (2006.01)

(52) U.S. Cl.
CPC ..... *H05K 7/20836* (2013.01); *H05K 7/20309* (2013.01); *H05K 7/20827* (2013.01)

(58) Field of Classification Search
CPC ........... H05K 7/20836; H05K 7/20309; H05K 7/20827
See application file for complete search history.

(56) References Cited

U.S. PATENT DOCUMENTS 6,574,104 B2 * 6/2003 Patel .................. H05K 7/20745
62/263
10,225,958 B1 * 3/2019 Gao .................... H05K 7/20781

FOREIGN PATENT DOCUMENTS

WO WO-2006023555 A2 * 3/2006 ................ C02F 3/04

\* cited by examiner

*Primary Examiner* — Waqaas Ali
(74) *Attorney, Agent, or Firm* — Intellent Patents LLC; Ahmed Alhafidh

(57) ABSTRACT

The present invention discloses systems and methods for optimized liquid cooling of data centers, featuring trickling filter towers for and biological oxygen demand (BOD) reduction in support of supplying non-potable water for evaporative cooling. A combination of e-pumps, flow sensors, and advanced controllers ensures continuous adaptation to fluctuating compute loads, weather conditions, and time-of-use (TOU) energy pricing. The approach mitigates reliance on remote data center load shifting, reduces operational costs, and preserves local water and energy resources. The invention also tolerates power fluctuations and minimal flow conditions, safeguarding critical cooling functions and biofilm viability with minimal energy consumption. As a result, data centers benefit from a resilient, efficient cooling infrastructure that integrates wastewater treatment and evaporative cooling, sustaining performance even under significant heat loads or resource constraints.

10 Claims, 3 Drawing Sheets

INTELLIGENT TRICKLING FILTER WATER RECYCLING TECHNOLOGY SUPPORTING ENERGY EFFICIENT EVAPORATIVE COOLING FOR DATA CENTER HEAT DISSIPATION

CLAIM OF PRIORITY

This application claims priority to and is a divisional application of U.S. Ser. No. 19/092,790 filed Mar. 27, 2025, titled "Intelligent Trickling Filter Water Recycling Technology Supporting Energy Efficient Evaporative Cooling for Data Center Heat Dissipation".

CROSS-REFERENCE TO RELATED PUBLICATIONS

The present application is related to U.S. Pat. Nos. 11,724,951, 12,017,941, and 12,304,849.

FIELD OF TECHNOLOGY

This disclosure relates generally to wastewater treatment process optimization and applications and, more particularly, to an intelligent trickling filter water recycling system supplying a non-potable water source for energy efficient evaporative cooling tower for data center heat dissipation.

BACKGROUND

The rapid proliferation of data centers across the globe, driven by the explosion of artificial intelligence (AI) and cloud computing, has exacerbated resource consumption challenges, particularly in the domains of water and energy. Data centers, which house thousands of servers performing continuous computational tasks, require extensive cooling systems to prevent overheating. Traditional cooling systems often rely on water-intensive methods, consuming millions of gallons of potable water daily. For instance, mid-sized data centers may consume 300,000 gallons of water per day, while larger facilities can use upwards of 5 million gallons daily. This demand places significant strain on local water resources, particularly in arid and drought-prone regions. Communities in these areas increasingly face competition for water between industrial uses and essential needs such as drinking water and agriculture.

Moreover, the high energy demands of data centers compound the problem. The reliance on GPU-based servers for AI applications, which consume four times more energy than traditional CPU-based servers, has intensified the need for robust cooling solutions. Conventional air-based and water-based cooling systems are energy-intensive and contribute significantly to the operational costs of data centers. This dual reliance on water and energy creates a feedback loop in which reducing dependency on one resource typically increases the dependency on the other, leaving operators with few sustainable options.

The environmental and social impact of these cooling systems cannot be overstated. Most data centers utilize potable water, which is chemically treated to prevent corrosion and bacterial growth in evaporative cooling towers. Once used, this water is often rendered unsuitable for human consumption or agricultural use, effectively removing it from the local water cycle. This exacerbates the challenges faced by water-stressed communities and increases tensions between industrial operations and local stakeholders. Additionally, as municipalities struggle with aging water infrastructure and growing regulatory requirements, the cost of accessing and treating water continues to rise, further straining data center operations.

Regulatory scrutiny and public awareness of these issues are increasing. Reports highlight the opaque nature of water usage reporting by major technology companies, fueling public concern about the unchecked expansion of data center facilities. In many cases, operators are not required to disclose their water consumption, leaving communities in the dark about the long-term sustainability of these operations. For example, some regions have witnessed legal battles over access to water usage data, underscoring the lack of transparency and accountability in the industry.

Adding to these challenges are the inherent inefficiencies in existing cooling technologies. Many systems operate without dynamic controls, maintaining constant cooling rates regardless of server loads. This lack of adaptability leads to unnecessary water and energy consumption during periods of low demand. Furthermore, conventional cooling systems often rely on large, centralized designs that lack the flexibility to adapt to emerging decentralized computing needs, such as edge data centers in urban areas. These centralized systems are typically ill-suited for integration into densely populated regions where space is at a premium and infrastructure must meet stringent environmental standards.

The growing demand for sustainable solutions is further complicated by the rapid pace of AI development. As AI models become more complex, requiring higher computational power, the cooling requirements for servers housing these workloads are expected to increase exponentially. Current solutions are ill-equipped to scale efficiently with this growth, leaving operators to face escalating operational costs and resource scarcity. Without significant innovation, the continued expansion of data centers risks amplifying the environmental and social challenges already associated with their operations.

SUMMARY

In one aspect, a liquid cooling system for high-density data center servers comprises one or more trickling filter (TF) towers configured to facilitate biofilm-mediated biochemical processes, the one or more TF towers comprising a media supporting aerobic nitrification and anaerobic denitrification of non-potable wastewater. The system also comprises an external cooling loop which incorporates one or more evaporative coolers thermally coupled to one or more heat exchangers, wherein non-potable wastewater treated by the one or more TF towers is supplied to the external cooling loop to dissipate heat transferred from the one or more heat exchangers. The system also comprises one or more controllers configured to modulate a flow rate of the non-potable wastewater through the external loop to optimize cooling and biochemical treatment efficiency.

In another aspect, a liquid cooling method for managing energy and water usage efficiency in data centers involves utilizing one or more evaporative cooling tower(s) thermally coupled to one or more heat exchangers in an external cooling loop and fluidly coupled to a trickling filter (TF) tower-based wastewater treatment plant, wherein the one or more heat exchangers are coupled to one or more servers operating at variable computational loads. The method also involves integrating server load data with tower recirculation rates to enable real-time adaptive external cooling and biofilm health maintenance through one or more controllers integrated with one or more variable frequency drive pumps, wherein tower recirculation rates are finely controlled based on one more sensors integrated with the variable frequency drive pumps. The method further involves employing a secondary, nitrified effluent as a cooling medium.

BRIEF DESCRIPTION OF THE DRAWINGS

The embodiments of this invention are illustrated by way of example and not limitation in the figures of the accompanying drawings, in which like references indicate similar elements and in which.

Figure 1:
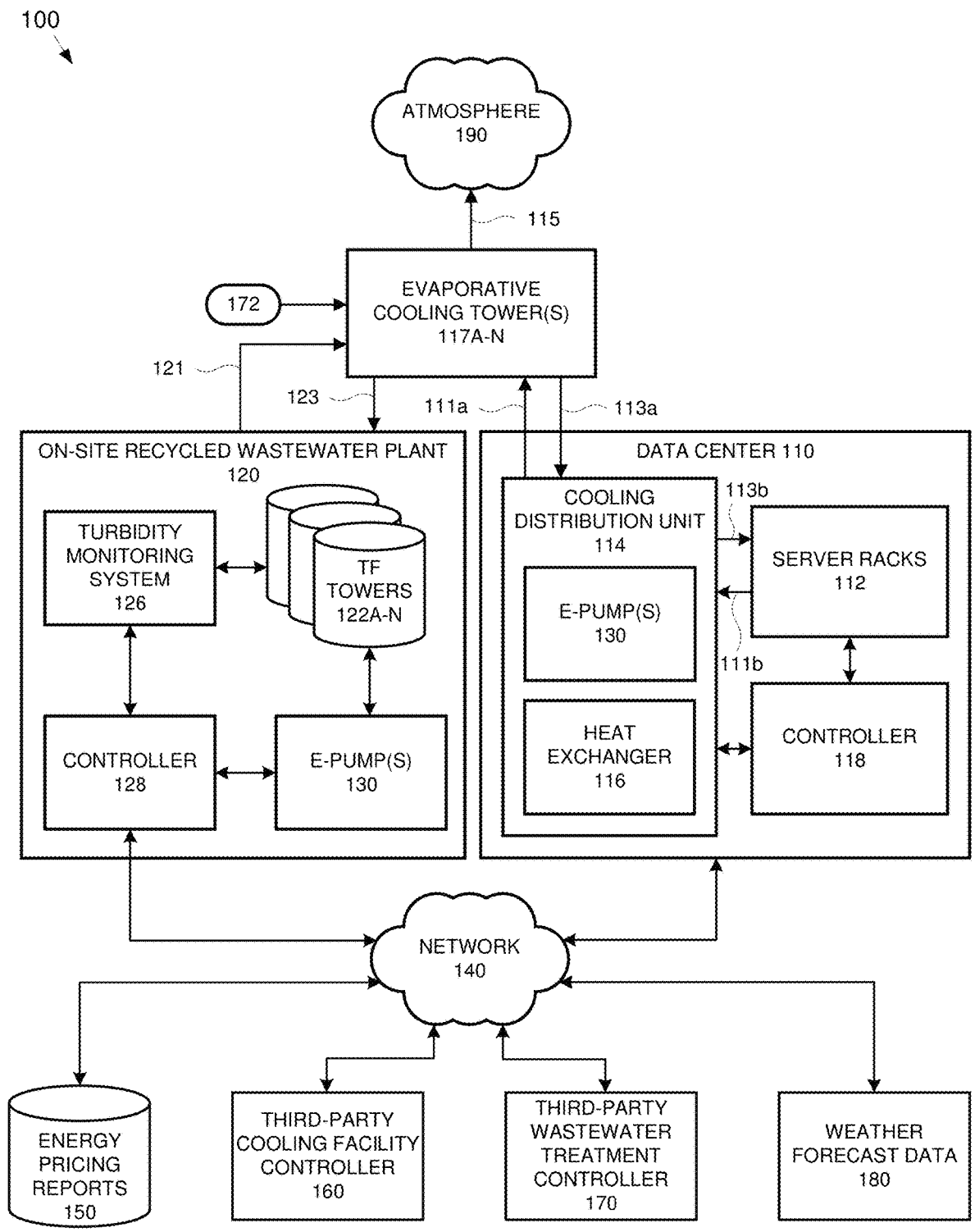
FIG. 1 is a block diagram of an exemplary liquid cooling system, according to one or more embodiments.

Other features of the present embodiments will be apparent from the accompanying drawings and from the detailed description that follows.

DETAILED DESCRIPTION

The present invention involves liquid cooling optimization systems and methods, particularly for tackling fluctuating artificial intelligence (AI) data center heat loads. As modern data centers increasingly accommodate higher performance AI workloads, liquid cooling systems must account for dynamic and often spiking heat loads generated by powerful compute nodes. Graphics processing units (GPUs), tensor processing units (TPUs), and neural processing units (NPUs)—often in high-density server racks—create thermal profiles that can fluctuate widely based on computational demands, training tasks, and inference loads.

Heat generated by these operations is dissipated through evaporative cooling towers integrated in an external cooling loop; the external cooling loop heat dissipation capacity depends on its access to water (typically, potable water is used) which absorbs these sudden surges in heat generation as it continuously flows through the tower media. The present invention involves supplying evaporative cooling towers non-potable water through an attached trickling filter (TF) tower-based wastewater treatment facility (See U.S. Pat. No. 11,724,951). Due to the open-air nature of TF towers, TF tower-based wastewater systems possess robust decentralized biological oxygen demand (BOD) reduction. Another key advantage of using TF towers is that they can continue to function in a low-energy or passive mode when power resources are constrained or diverted. This inherent passivity means they can operate effectively during times of grid fluctuation, brownouts, or times when local power prices are prohibitively high. When coupled to an energy intensive cooling system with high water demand, the result is an adaptable cooling system where a typically underutilized or localized wastewater treatment process serves as a thermal buffer for data centers that must maintain constant operational readiness, even under extreme thermal loads.

Conventional data center load-balancing strategies often shift compute tasks to facilities where water and energy are cheapest or most readily available at a given hour. However, such transfers can consume substantial inter-facility bandwidth and can introduce latency or synchronization overheads. Through the systems and methods disclosed, local data centers equipped with TF tower-based cooling gain new flexibility in meeting peak computational demands without overly relying on geographic load distribution. By leveraging on-site non-potable water, possibly drawn from a local municipal or industrial wastewater source, the cooling system offloads the burden on municipal freshwater supply.

Furthermore, because this system permits the local data center to handle higher transient loads efficiently, it reduces both the need for scheduling compute tasks in remote regions and the associated operational costs of large-scale data routing. This reduced data transfer also mitigates network congestion and can yield a net reduction in overall energy consumption, due to fewer transmissions across wide area networks. In effect, local resources—energy, water, or wastewater—are utilized in a way that is more ecologically sustainable and less sensitive to global fluctuations in resource pricing and availability.

Reference is made to FIG. 1, which is a block diagram showing a liquid cooling system 100, according to one or more embodiments. In one or more embodiments the liquid cooling system 100 dissipates heat generated by a heat source, such as a data center 110, through one or more evaporative cooling tower(s) 117A-N. Heated water 111a flows from the data center 110 to the evaporative cooling tower(s) 117A-N, water vapor 115 escapes from the evaporative cooling tower(s) 117A-N to the atmosphere 190, and chilled water 113a returns from the evaporative cooling tower(s) 117A-N to the data center 110, constituting an external cooling loop. The data center 110 may comprise one or more server racks 112 (e.g. utilizing Blackwell chip architecture) thermally coupled to a cooling distribution unit (CDU) 114 configured to transfer heat 111b from the server racks 112 to a heat exchanger 116. The CDU 114 may utilize various liquid-based cooling techniques, including direct-to-chip, rear-door heat exchangers, cold-plate solutions, immersion cooling tanks, or hybrid methods. Chilled water 113b returns to the server racks 112 from the heat exchanger 116 as heat is transferred across from the internal loop (server racks 112 to CDU 114) to the external loop (CDU 114 to the evaporative cooling tower(s) 117A-N).

Heat dissipation through the external cooling loop may be transferred to the atmosphere in 190 in the form of water vapor 115. The typically fluctuating water consumption patterns of a data center 110 require a steady supply of incoming water to offset losses due to heat dissipation through the external cooling loop. Incoming water supply may be provided primarily through an on-site recycled wastewater plant 120 in the form of non-potable water 121, such as secondary effluent. Alternately or in combination with the on-site recycled wastewater plant 120, the evaporative cooling tower(s) 117A-N water supply may be replenished by one or more off-site local recycled wastewater plant(s) 172. Blowdown losses 123 from cleaning the evaporative cooling tower(s) 117A-N may be returned to the on-site recycled wastewater plant 120 directly or indirectly through local sewage.

Figure 3:
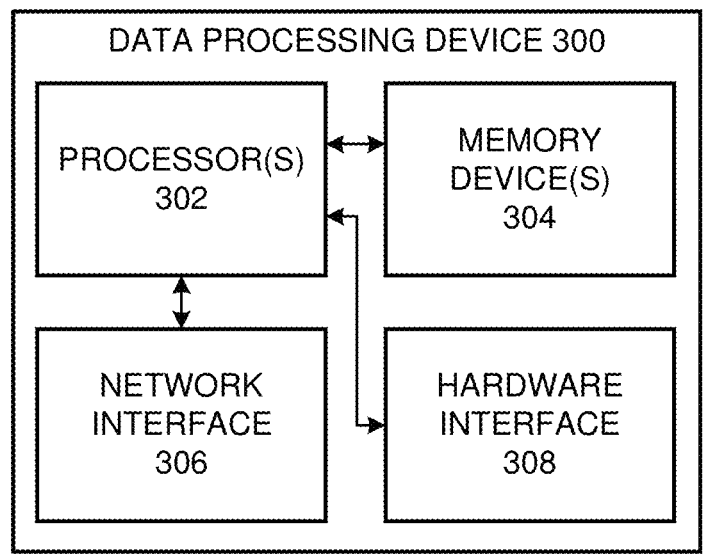
FIG. 3 is a block diagram of a data processing device, according to one or more embodiments.

The data center 110 may also comprise a controller 118, which may encompass, inter alia, one or more aspects of data center operations, such as governing compute load distribution, analyzing and adjusting CDU 114 parameters, and adjusting a flow rate of one or more of the e-pump(s) 130. In an alternate embodiment, the controller 118 may be integrated into the one or more e-pump(s) 130 and may be programmed to execute one or more feedback-based control loops with the purpose of adjusting a flow rate of one or more of the e-pump(s) 130. For example, the controller 118 may be a stand-alone programmable logic controller (PLC), a model predictive control (MPC) controller, or a conventional feedback controller such as a proportional integral derivative (PID) controller. In another example, the controller 118 may be a general-purpose data processing device 300 (as shown in FIG. 3) comprising one or more processor(s) 302 (e.g. a central processing unit (CPU), a GPU, a TPU, an NPU), one or more memory devices 304, a network interface 306 which may allow the controller 118 to be communicatively coupled to a network 140 (e.g., a wide area network (WAN), a local area network (LAN)), and a hardware interface 308. In more integrated embodiments, the controller 118 may exist as software executed by the same hardware used for AI computations—i.e. the data center's server cluster—to provide real-time control logic.

The on-site recycled wastewater plant 120 may comprise a controller 128 (which may be similar to controller 118) configured to manage the operational flow of non-potable water 121 from one or more TF towers 122A-N to the evaporative cooling tower(s) 117. The controller 128 may be communicatively coupled to a network 140 and may access third-party databases such as energy pricing reports 150, third-party cooling facility controllers 160, and third-party wastewater treatment controllers 170. Energy pricing reports may comprise time-of-use (TOU) schema data which are provided by energy utility companies to incentivize the use of electricity during off-peak hours and/or disincentivize the use of electricity during peak hours. Although the BOD reduction demands and heat transfer demands of the liquid cooling system 100 may not be fully satisfied during off-peak hours, the liquid cooling system 100 may be configured to prioritize time-sensitive tasks while schedule non-time sensitive tasks to off-peak hours. For example, during peak hours but outside of peak wastewater loads (e.g. no incoming stormwater), BOD reduction tasks may be postponed to off-peak hours to prioritize power usage for heat transfer demands. This is due to the unique ability of TF towers 122A-N to operate passively with very low power (to maintain the media biofilm), which is useful during power outages or brownouts. Other wastewater treatment methods such as membrane bioreactors (MBRs) require a high minimum flow and cannot operative passively. As such, rotating overhead distributors may not be usable since they must always be kept balanced and in motion and cannot tolerate abrupt start/stop cycles. Instead, the TF towers 122A-N may be outfitted with fixed self-cleaning nozzles which can withstand intermittent or reduced flows without hardware damage, allowing for abrupt start/stop cycles and partial load operations. Under normal conditions, a tower application rate may be adjusted between 0.8 to 1.0 gallons per minute/square foot of tower (gpm/sf). For very short-term peak loads, the tower application rate may be adjusted to 1.3 gpm/sf to absorb any abnormal peak load with negligible impact on TF tower biology. Over time, this approach can mitigate or even eliminate the necessity to shift compute loads to remote data centers, improving local performance and preserving fiber network bandwidth.

Additionally, the controller 128 may be configured to modulate flow rates based on weather forecast data 180 received through the network 140. For example, expected heavy rainfall might lead to higher volumes of stormwater, diluting the BOD concentration of incoming wastewater. Conversely, drought conditions might reduce the overall supply of non-potable water, requiring stricter management of flow rates and retention times to maintain BOD removal efficiencies and stable cooling capacity. The controllers can thus make predictive adjustments—e.g., accelerating BOD removal before a storm front arrives, or storing partially treated effluent for reuse during a subsequent heatwave.

This wastewater treatment framework ensures that the data center 110 can remain operational even under less-than-ideal circumstances, including mechanical pump failures, supply chain disruptions of chemicals, or sudden surges in electricity prices. By sustaining a small but crucial water flow through the TF towers 122A-N, the biofilm on the surface of the media therein remains viable, enabling quick ramp-up of cooling capacity as soon as power or waste stream availability recovers. This resilience serves as a key advantage over more power-intensive or flow-sensitive membrane systems, which typically cannot tolerate extended low-flow or no-flow conditions without risking critical membrane damage or fouling.

Figure 2:
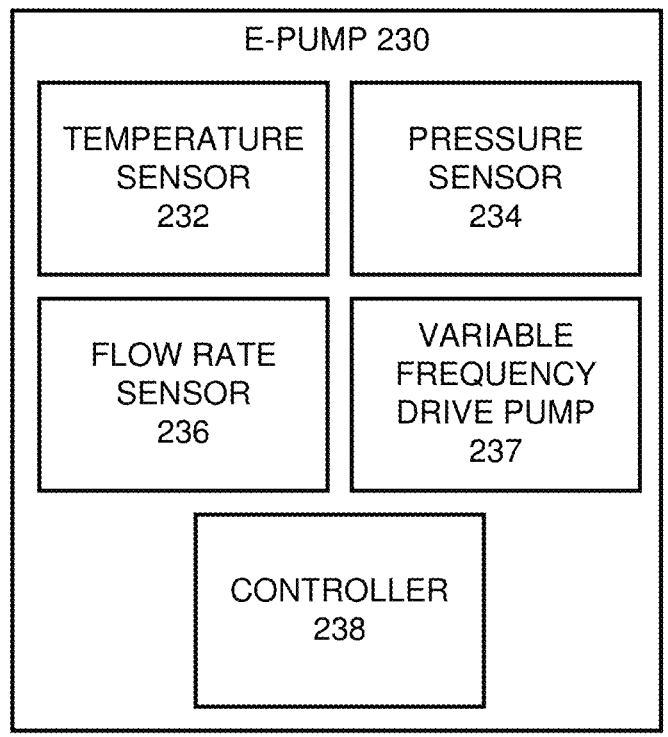
FIG. 2 is a block diagram of an exemplary e-pump, according to one or more embodiments.

Reference is made to FIG. 2, which is a block diagram of an exemplary e-pump 230, according to one or more embodiments. "E-pump" may refer to an electromechanical device configured to monitor and regulate fluid flow within the liquid cooling system 100; the e-pump 230 may comprise a temperature sensor 232, a pressure sensor 234, a flow rate sensor 236, a variable frequency drive (VFD) pump 237, and a controller 238. The e-pump 230 enables precise, automated control of both cooling fluid circulation in the external cooling loop and the internal cooling loop and wastewater cycling through the TF towers 122A-N based on feedback from the sensors of one or more of the e-pumps.

Figure 4:
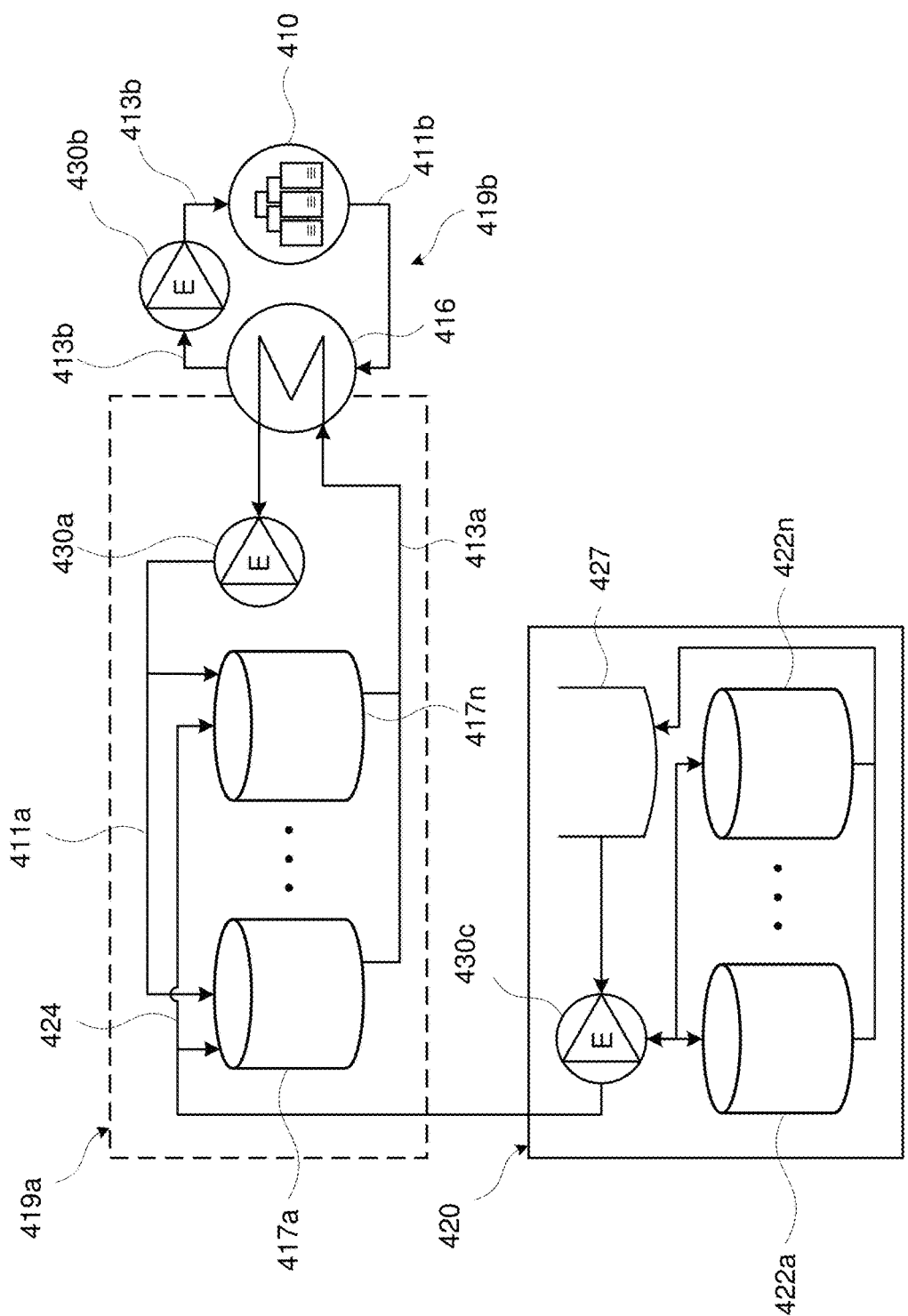
FIG. 4 is a schematic diagram showing the flow of heat and cooling medium in the liquid cooling system of FIG. 1, according to one or more embodiments.

Reference is additionally made to FIG. 4, a schematic diagram showing the flow of heated and cooled medium in the liquid cooling system of FIG. 1. The temperature sensors of the e-pumps 430a-c may monitor the temperature of the fluid entering or exiting the e-pumps 430a-c and provide real-time feedback to its controller, allowing the system to determine whether additional cooling capacity is needed (e.g., when fluid temperature exceeds a threshold) or whether flow rates may be reduced to conserve energy. The pressure sensor 234 may measure fluid pressure within the pump housing or along the external cooling loop 419a or the internal cooling loop 419b; pressure readings therefrom may allow the system to protect pump hardware and other system components from overpressure, backpressure, or vacuum conditions. The pressure sensor 234 may also facilitate detecting potential blockages or flow restrictions (e.g., scaling within the TF tower nozzles or partial clogging of conduits). The flow rate sensor 236 may continuously gauge the volumetric flow rate of the liquid passing through the e-pumps 230 and may communicate flow rate data to the controller 238, which can adjust the pump flow rate accordingly (i.e., 0.8 to 1.3 gpm/sf when supplying the TF towers 422a-n). Maintaining the flow rate within the on-site recycled wastewater plant 420 helps maintain consistent biofilm health in the TF towers 422a-n by ensuring a target application rate.

The VFD pump 237 may incorporate a VFD motor that can continuously modulate its speed or torque output based on instructions from the controller 238. The VFD pump 237 allows fine-grained control over e-pump 230 operation, reducing energy consumption during periods of low or moderate cooling demand. The VFD pump 237 also facilitates soft-start and soft-stop routines, reducing mechanical stresses on both the VFD pump 237 and the downstream piping during abrupt load changes. Direct control of flow rates through the VFD pump 237 prevents the need to use flow valves, vastly reducing backpressure and reducing wear and tear on system components. The controller 238 may be implemented as an embedded microcontroller, a PLC, or another compact data processing device local to the e-pump 230. The controller 238 may receive sensor signals (temperature, pressure, flow) and executes control logic or algorithms (e.g., PID, MPC) that determine optimal pump speed. The controller 238 may function autonomously or coordinate with higher-level controllers (e.g., controller 118, controller 128) or off-site controllers (e.g., third-party cooling facility controller 160, third-party wastewater treatment controller 170) via wired or wireless communication channels. Additionally, the controller 238 may store calibration parameters, safety thresholds, historical performance data, and dynamic control logic to facilitate adaptable operation, diagnostics and predictive maintenance.

In typical operation, the e-pumps 430a-c transition through various phases according to system demands and external conditions. For example, during standby or low-flow operation, the data center 410 generates low heat loads; thus, the e-pump 430a may operate at a minimal rate (0.8 gpm/sf) or may be turned off entirely while the e-pump 430c maintains a baseline flow rate to the TF towers 422a-n to maintain the biofilm therein. Temperature sensor data may be monitored to ensure that the coolant fluid does not exceed temperature thresholds. At peak cooling demand loads, the data center 410 may experience heavy computational loads and the temperature sensor of the e-pump 430b may detect elevated temperatures in the heated water 411b. The e-pump 430b may respond by increasing flow rates of chilled water 413b to the server rack of the data center 410. The e-pump 430a may respond by increasing flow rates of heated water 411a to the evaporative cooling tower(s) 417a-n and the e-pump 430c may respond by increasing flow rates of wastewater 424 to the evaporative cooling tower(s) 417a-n to maximize heat dissipation. Chilled water 413a returns from the evaporative cooling tower(s) 417a-n to the heat exchanger 416. During peak cooling demand loads, the TF-tower 422a-n application rate may be minimized to provide excess effluent to the evaporative cooling tower(s) 417a-n but also preserve biofilm health (e.g. 0.8 gpm/sf). The turbidity monitoring system 326 may be utilized to monitor effluent quality, allowing the recycled wastewater plant 420 to adjust flow rates to meet BOD reduction demands.

Although a minimal representation of the recycled wastewater plant 420 is shown in FIG. 4, it should be understood that other structural features which underly wastewater processes may be also involved but not illustrated in order to highlight the role of TF towers in dynamic wastewater supply for a modern AI data center liquid cooling system. It should be appreciated that, for example, a flow equalization basin 427 may be utilized to uniformly distribute wastewater flows between multiple TF towers 422a-n. A partitioned flow equalization basin 427 may be used to adjustably manage wastewater volumes before, during, and after power outages, peak loads, and drought conditions. Other wastewater plant features and components discussed in U.S. Pat. No. 11,724,951 may not be shown in FIG. 4 but may be integrated into the on-site recycled wastewater plant 420.

Embodiments of the subject matter and the functional operations described in this specification can be implemented in one or more of the following: digital electronic circuitry; tangibly-embodied computer software or firmware; computer hardware, including the structures disclosed in this specification and their structural equivalents; and combinations thereof. Such embodiments can be implemented as one or more modules of computer program instructions encoded on a tangible non-transitory program carrier for execution by, or to control the operation of, data processing apparatus (i.e., one or more computer programs). Program instructions may be, alternatively or additionally, encoded on an artificially generated propagated signal (e.g., a machine-generated electrical, optical, or electromagnetic signal) that is generated to encode information for transmission to suitable receiver apparatus for execution by a data processing apparatus. And the computer storage medium can be one or more of: a machine-readable storage device, a machine-readable storage substrate, a random or serial access memory device, and combinations thereof.

As used herein, the term "data processing device" comprises all kinds of apparatuses, devices, and machines for processing data, including but not limited to, a programmable processor, a computer, and/or multiple processors or computers. Exemplary apparatuses may include special purpose logic circuitry, such as a field programmable gate array ("FPGA") and/or an application specific integrated circuit ("ASIC"). In addition to hardware, exemplary apparatuses may comprise code that creates an execution environment for the computer program (e.g., code that constitutes one or more of: processor firmware, a protocol stack, a database management system, an operating system, and a combination thereof).

The term "computer program" may also be referred to or described herein as a "program," "software," a "software application," a "module," a "software module," a "script," or simply as "code." A computer program may be written in any form of programming language, including compiled or interpreted languages, or declarative or procedural languages, and it can be deployed in any form, including as a standalone program or as a module, component, subroutine, or other unit suitable for use in a computing environment. Such software may correspond to a file in a file system. A program can be stored in a portion of a file that holds other programs or data. For example, a program may include one or more scripts stored in a markup language document; in a single file dedicated to the program in question; or in multiple coordinated files (e.g., files that store one or more modules, sub programs, or portions of code). A computer program can be deployed and/or executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, such as but not limited to an FPGA and/or an ASIC.

Computers suitable for the execution of the one or more computer programs include, but are not limited to, general purpose microprocessors, special purpose microprocessors, and/or any other kind of central processing unit ("CPU"). Generally, CPU will receive instructions and data from a read only memory ("ROM") and/or a random access memory ("RAM"). The essential elements of a computer are a CPU for performing or executing instructions and one or more memory devices for storing instructions and data. Generally, a computer will also include, or be operatively coupled to receive data from or transfer data to, or both, one or more mass storage devices for storing data (e.g., magnetic, magneto optical disks, and/or optical disks). However, a computer need not have such devices. Moreover, a computer may be embedded in another device, such as but not limited to, a mobile telephone, a personal digital assistant ("PDA"), a mobile audio or video player, a game console, a Global Positioning System ("GPS") receiver, or a portable storage device (e.g., a universal serial bus ("USB") flash drive).

Computer readable media suitable for storing computer program instructions and data include all forms of nonvolatile memory, media and memory devices. For example, computer readable media may include one or more of the following: semiconductor memory devices, such as erasable programmable read-only memory ("EPROM"), electrically erasable programmable read-only memory ("EEPROM") and/or and flash memory devices; magnetic disks, such as internal hard disks or removable disks; magneto optical disks; and/or CD ROM and DVD-ROM disks. The processor and the memory can be supplemented by, or incorporated in, special purpose logic circuitry.

To provide for interaction with a user, embodiments may be implemented on a computer having any type of display device for displaying information to a user. Exemplary display devices include, but are not limited to one or more of: projectors, cathode ray tube ("CRT") monitors, liquid crystal displays ("LCD"), light-emitting diode ("LED") monitors and/or organic light-emitting diode ("OLED") monitors. The computer may further comprise one or more input devices by which the user can provide input to the computer. Input devices may comprise one or more of: keyboards, a pointing device (e.g., a mouse or a trackball). Input from the user can be received in any form, including acoustic, speech, or tactile input. Moreover, feedback may be provided to the user via any form of sensory feedback (e.g., visual feedback, auditory feedback, or tactile feedback). A computer can interact with a user by sending documents to and receiving documents from a device that is used by the user (e.g., by sending web pages to a web browser on a user's client device in response to requests received from the web browser).

Embodiments of the subject matter described in this specification can be implemented in a computing system that includes one or more of the following components: a backend component (e.g., a data server); a middleware component (e.g., an application server); a frontend component (e.g., a client computer having a graphical user interface ("GUI") and/or a web browser through which a user can interact with an implementation of the subject matter described in this specification); and/or combinations thereof. The components of the system can be interconnected by any form or medium of digital data communication, such as but not limited to, a communication network. Non-limiting examples of communication networks include a local area network ("LAN") and a wide area network ("WAN"), e.g., the Internet.

The computing system may include clients and/or servers. The client and server may be remote from each other and interact through a communication network. The relationship of client and server arises by virtue of computer programs running on the respective computers and having a client-server relationship to each other.

Various embodiments are described in this specification, with reference to the detailed discussed above, the accompanying drawings, and the claims. Numerous specific details are described to provide a thorough understanding of various embodiments. However, in certain instances, well-known or conventional details are not described in order to provide a concise discussion. The figures are not necessarily to scale, and some features may be exaggerated or minimized to show details of particular components. Therefore, specific structural and functional details disclosed herein are not to be interpreted as limiting, but merely as a basis for the claims and as a representative basis for teaching one skilled in the art to variously employ the embodiments.

The embodiments described and claimed herein and drawings are illustrative and are not to be construed as limiting the embodiments. The subject matter of this specification is not to be limited in scope by the specific examples, as these examples are intended as illustrations of several aspects of the embodiments. Any equivalent examples are intended to be within the scope of the specification. Indeed, various modifications of the disclosed embodiments in addition to those shown and described herein will become apparent to those skilled in the art, and such modifications are also intended to fall within the scope of the appended claims.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

All references including patents, patent applications and publications cited herein are incorporated herein by reference in their entirety and for all purposes to the same extent as if each individual publication or patent or patent application was specifically and individually indicated to be incorporated by reference in its entirety for all purposes.

What is claimed is:

1. A liquid cooling system for high-density data center servers, comprising:
   one or more trickling filter (TF) towers configured to facilitate biofilm-mediated biochemical processes, the one or more TF towers comprising a media supporting aerobic nitrification and anaerobic denitrification of non-potable wastewater;
   an external cooling loop comprising one or more evaporative coolers thermally coupled to one or more heat exchangers, wherein non-potable wastewater treated by the one or more TF towers is supplied to the external cooling loop to dissipate heat transferred from the one or more heat exchangers; and one or more controllers configured to modulate a flow rate of the non-potable wastewater through the external loop to optimize cooling and biochemical treatment efficiency.

2. The system of claim 1, wherein the one or more TF towers comprise a plurality of fixed self-cleaning overhead nozzles.

3. The system of claim 1, wherein modulating the flow rate involves dynamically controlling the flow rate through one or more variable frequency drive pumps of the external cooling loop.

4. The system of claim 1, further comprising a turbidity monitoring system configured to measure an effluent quality of the non-potable wastewater.

5. The system of claim 4, wherein the one or more controllers are further configured to modulate the flow rate based on the effluent quality.

6. The system of claim 1, wherein the one or more controllers are further configured to modulate the flow rate based on one or more time-oriented energy pricing rules to minimize a peak hour cooling cost.

7. The system of claim 1, wherein modulating the flow rate through the external loop involves dynamically controlling the flow rate based on heat load data associated with the one or more heat exchangers.

8. The system of claim 1, wherein modulating the flow rate involves maintaining a tower application rate of 0.8 to 1.0 gallons per minute per square foot.

9. The system of claim 8, wherein modulating the flow rate during a short-term peak load involves adjusting the tower application rate to 1.3 gallons per minute per square foot.

10. The system of claim 1, wherein modulating the flow rate involves adjusting the flow rate to maintain an effluent quality of below a biochemical oxygen demand (BOD) threshold of 10 mg/L.

* * * * *